US010157901B2

(12) United States Patent
Lai et al.

(10) Patent No.: US 10,157,901 B2
(45) Date of Patent: Dec. 18, 2018

(54) SEMICONDUCTOR DEVICE AND METHOD OF MANUFACTURING

(71) Applicant: Taiwan Semiconductor Manufacturing Company, Ltd., Hsinchu (TW)

(72) Inventors: Jui Hsieh Lai, Taoyuan (TW); Ying-Hao Kuo, Hsinchu (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 16 days.

(21) Appl. No.: 15/797,733

(22) Filed: Oct. 30, 2017

(65) Prior Publication Data

US 2018/0061818 A1 Mar. 1, 2018

Related U.S. Application Data

(60) Continuation of application No. 15/243,441, filed on Aug. 22, 2016, now Pat. No. 9,806,069, which is a division of application No. 13/956,769, filed on Aug. 1, 2013, now Pat. No. 9,423,578.

(51) Int. Cl.
*G02B 6/12* (2006.01)
*H01L 25/00* (2006.01)
*G02B 6/42* (2006.01)
*H01L 23/538* (2006.01)
*H01L 23/498* (2006.01)
(Continued)

(52) U.S. Cl.
CPC .......... *H01L 25/50* (2013.01); *G02B 6/12002* (2013.01); *G02B 6/13* (2013.01); *G02B 6/4232* (2013.01); *H01L 21/481* (2013.01); *H01L 21/4853* (2013.01); *H01L 21/56* (2013.01); *H01L 23/48* (2013.01); *H01L 23/49811* (2013.01); *H01L 23/5389* (2013.01); *H01L 24/19* (2013.01); *H01L 24/20* (2013.01); *H01L 24/73* (2013.01); *H01L 24/96* (2013.01); *G02B 6/132* (2013.01); *G02B 6/43* (2013.01); *H01L 24/13* (2013.01); *H01L 24/16* (2013.01); *H01L 2224/04105* (2013.01); *H01L 2224/12105* (2013.01); *H01L 2224/13144* (2013.01); *H01L 2224/16225* (2013.01); *H01L 2224/81192* (2013.01); *H01L 2924/00* (2013.01);
(Continued)

(58) Field of Classification Search
CPC .... G02B 6/12002; G02B 6/13; G02B 6/4232; H01L 25/50; H01L 21/481; H01L 21/4853; H01L 21/56; H01L 23/48; H01L 23/49811; H01L 23/5389; H01L 24/19; H01L 24/20; H01L 24/73; H01L 24/96
USPC ........................................................ 438/109
See application file for complete search history.

(56) References Cited

U.S. PATENT DOCUMENTS 5,199,087 A 3/1993 Frazier
7,378,925 B2 5/2008 Ito et al.
(Continued)

*Primary Examiner* — Jerry Blevins
(74) *Attorney, Agent, or Firm* — Slater Matsil, LLP

(57) ABSTRACT

A semiconductor device includes a first chip, a dielectric layer over the first chip, and a second chip over the dielectric layer. A conductive layer is embedded in the dielectric layer and is electrically coupled to the first chip and the second chip. The second chip includes an optical component. The first chip and the second chip are arranged on opposite sides of the dielectric layer in a thickness direction of the dielectric layer.

20 Claims, 10 Drawing Sheets

(51) Int. Cl.
  *H01L 23/48*   (2006.01)
  *G02B 6/13*    (2006.01)
  *H01L 21/48*   (2006.01)
  *H01L 21/56*   (2006.01)
  *G02B 6/43*    (2006.01)
  *G02B 6/132*   (2006.01)
  *H01L 23/00*   (2006.01)

(52) U.S. Cl.
  CPC .......... *H01L 2924/013* (2013.01); *H01L 2924/0105* (2013.01); *H01L 2924/13091* (2013.01)

(56) References Cited

U.S. PATENT DOCUMENTS

| | | | |
|---|---|---|---|
| 8,476,745 B2* | 7/2013 | Tu | H01L 23/5223 257/666 |
| 2002/0185737 A1* | 12/2002 | Regan | B81C 1/0023 257/757 |
| 2003/0026522 A1* | 2/2003 | Chiaretti | G02B 6/3538 385/15 |
| 2003/0081924 A1* | 5/2003 | Yegnanarayanan | B82Y 20/00 385/132 |
| 2004/0052467 A1 | 3/2004 | Blauvelt et al. | |
| 2007/0127862 A1 | 6/2007 | Mitomi et al. | |
| 2009/0294949 A1* | 12/2009 | Meyer | G02B 6/4201 257/690 |
| 2010/0220956 A1* | 9/2010 | Saarikko | G02B 6/0028 385/37 |
| 2012/0213470 A1 | 8/2012 | Matsuoka et al. | |
| 2013/0334404 A1* | 12/2013 | Pinguet | G02B 6/124 250/208.2 |

* cited by examiner

SEMICONDUCTOR DEVICE AND METHOD OF MANUFACTURING

PRIORITY CLAIM AND CROSS-REFERENCE

This application is a continuation of U.S. patent application Ser. No. 15/243,441, entitled "Semiconductor Device and Method of Manufacturing," filed on Aug. 22, 2016, which is a divisional of U.S. patent application Ser. No. 13/956,769, entitled "Semiconductor Device and Method of Manufacturing," filed on Aug. 1, 2013, now U.S. Pat. No. 9,423,578 issued Aug. 23, 2016, which applications are incorporated herein by reference.

BACKGROUND

As integrated circuits (ICs or chips) become increasingly smaller and faster, electrical signals used in various types of ICs are also subject to increasing delays caused by capacitance, inductance, or resistance in the ICs. At a certain high speed and/or frequency, such delays become a design concern. To avoid potential signal delay issues, optical signals are used instead of electrical signals for data transmission in some situations. Such an approach leads to a combination of a chip for handling electrical signals and another chip for handling optical signals in an IC package.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1A:
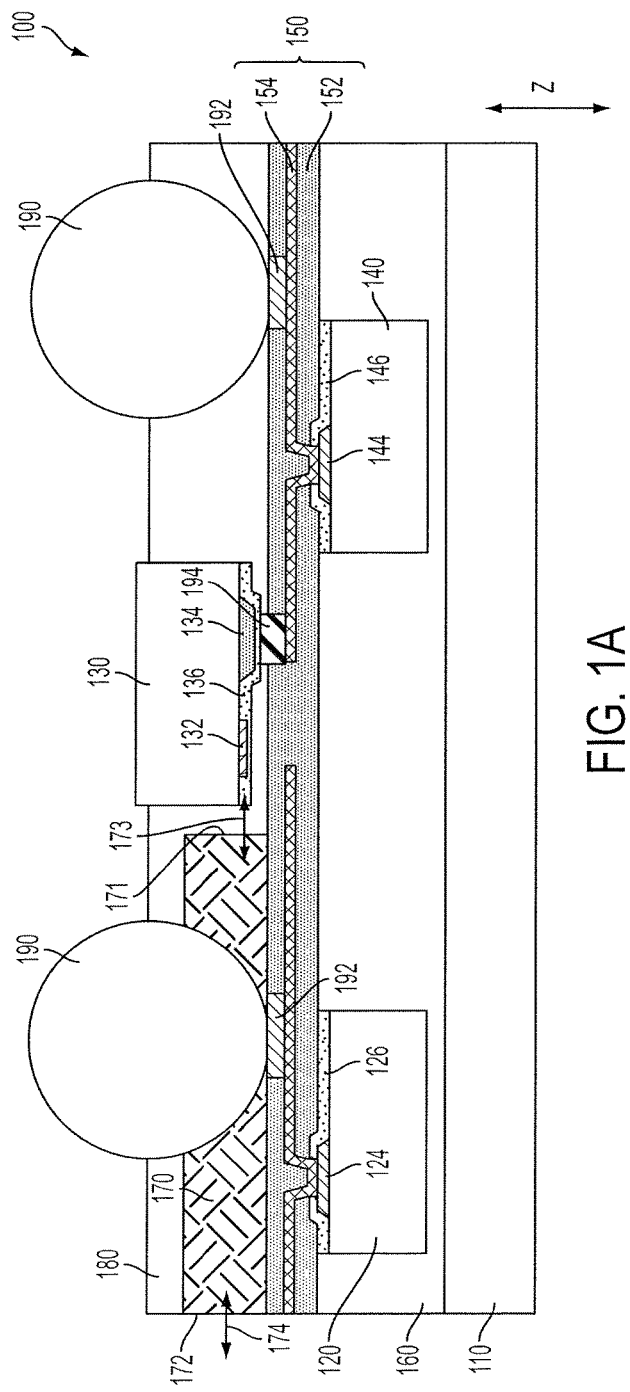
FIG. 1A is a schematic cross-sectional view of a semiconductor device in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details. Like reference numerals in the drawings denote like elements.

In some embodiments, a semiconductor device comprises a first chip and a second chip. The second chip comprises an optical component. The first chip and the second chip are arranged on opposite sides of a re-distribution layer in a thickness direction of the re-distribution layer. As a result, a multichip module (MCM) with small footprint is obtained in at least one embodiment. In some embodiments, the second chip with the optical component is bonded to the re-distribution layer after forming a molding material around the first chip. As a result, in one or more embodiments, bonding accuracy of the second chip is unlikely to be affected by the molding material and/or the molding process of forming the molding material around the first chip.

FIG. 1A is a schematic cross-sectional view of a semiconductor device 100 in accordance with some embodiments. The semiconductor device 100 comprises a substrate 110, a first chip 120, a second chip 130, a third chip 140, a re-distribution layer 150, a molding material 160, a waveguide 170, an encapsulating material 180, and one or more conductive bumps 190.

In some embodiments, the substrate 110 includes a silicon carbide (SiC) substrate, sapphire substrate, a silicon (Si) substrate or a glass substrate. In at least one embodiment, the substrate 110 is omitted.

The first chip 120 includes one or more active components and/or passive components configured to process, receive and/or transmit electrical signals. Examples of passive components include, but are not limited to, resistors, capacitors and inductors. Examples of active components include, but are not limited to, diodes, field effect transistors (FETs), metal-oxide-semiconductor FETs (MOSFETs), complementary metal-oxide-semiconductor (CMOS) transistors, and bipolar transistors. In some embodiments, the first chip 120 includes a bare chip or die. In some embodiments, the first chip 120 includes a stack of chips. The first chip 120 is referred to herein as an "electrical chip."

The electrical chip 120 has at least one contact pad 124 formed on a surface of the electrical chip 120. The contact pad 124 is electrically coupled to the one or more active components and/or passive components of the electrical chip 120 for communication of electrical signals between the electrical chip 120 and external circuitry. Example materials of the contact pad 124 include, but are not limited to, aluminum and copper. The electrical chip 120 further has a passivation layer 126 formed over the surface of the electrical chip. The passivation layer 126 has an opening that exposes at least a portion of the contact pad 124. Example materials of the passivation layer 126 include, but are not limited to, silicon oxide, silicon nitride, low-k dielectrics such as carbon doped oxides, extremely low-k dielectrics such as porous carbon doped silicon dioxide, and combinations thereof.

The second chip 130 includes at least one optical component 132 configured to process, receive and/or transmit optical signals. Optical signals are signals carried by photons and are different from electrical signals which are signals carried by electrical charges, such as electrons, holes or ions. Examples of optical components include, but are not limited to, light emitting devices such as lasers and light emitting diodes, light detecting devices such as photosensors, optical modulators and optical couplers. In at least one embodiment, the second chip 130 further includes one or more active and/or passive components configured to process, receive and/or transmit electrical signals converted to/from optical signals by the optical component 132. The second chip or a chip including an optical component is referred to herein as an "optical chip." However, as discussed herein, in some embodiments an optical chip is also configured to handle electrical signals.

The optical chip 130 includes at least one contact pad 134 formed on a surface of the optical chip, and a passivation layer 136 formed over the surface of the optical chip and exposing the contact pad. Example materials of the contact pad 134 include, but are not limited to, aluminum, copper and gold. Example materials of the passivation layer 136 include, but are not limited to, silicon oxide, silicon nitride, low-k dielectrics such as carbon doped oxides, extremely low-k dielectrics such as porous carbon doped silicon dioxide, and combinations thereof. In at least one embodiment, the passivation layer 136 overs the optical component 132 and is made of a material transparent to the optical signals (i.e., light) transmitted and/or received by the optical component 132. In the embodiment specifically shown in FIG. 1A, the optical component 132 is arranged on the same surface of the optical chip 130 as the contact pad 134. Other arrangements are within the scope of various embodiments.

The third chip 140 is also an electrical chip. The electrical chip 140 has at least one contact pad 144 formed on a surface of the electrical chip 140, and a passivation layer 146 formed over the surface of the electrical chip and exposing the contact pad. In at least one embodiment, the contact pad 144 and the passivation layer 146 are configured similarly to the contact pad 124 and the passivation layer 126. In at least one embodiment, the electrical chip 120 or the electrical chip 140 is omitted.

The re-distribution layer 150 is arranged between the optical chip 130 on one side, and the electrical chips 120, 140 on the other side in a thickness direction Z of the re-distribution layer 150. The re-distribution layer 150 includes at least one dielectric layer 152 and at least one conductive layer 154 embedded in the dielectric layer 152. The conductive layer 154, also referred to as post-passivation interconnect (PPI), is made of a conductive material and includes a plurality of conductive patterns electrically coupled to the contact pads 124, 144 and 134 of the corresponding electrical chips 120, 140 and optical chip 130. Example materials of the dielectric layer 152 include, but are not limited to, epoxy, polyimide, benzocyclobutene (BCB), polybenzoxazole (PBO), other organic dielectric materials. Alternatively, in one or more embodiments, the dielectric layer 152 is formed of a material similar to the material used as the passivation layer 126, such as silicon oxides, silicon nitrides, low-k dielectrics, extremely low-k dielectrics, and combinations thereof. Example materials of the conductive layer 154 include, but are not limited to, at least one of a copper (Cu) layer, an aluminum (Al) layer, a copper alloy layer, a nickel layer, a gold layer, or other conductive materials.

In some embodiments, the optical chip 130 is electrically coupled to an electrical chip via the re-distribution layer 150. For example, the optical chip 130 is electrically coupled to the electrical chip 140 via the re-distribution layer 150, as shown in FIG. 1A. In some embodiments, although the optical chip 130 and an electrical chip are both electrically coupled to the redistribution layer 150, the optical chip 130 is not directly electrically coupled to the electrical chip via the re-distribution layer. For example, the optical chip 130 and the electrical chip 120 are not directly electrically coupled by the re-distribution layer 150, as shown in FIG. 1A. In at least one embodiment, the optical chip 130 is electrically coupled to the electrical chip 120 via the redistribution layer 150 and the electrical chip 140. For example, electrical signals outputted at the contact pad 134 of the optical chip 130 are communicated via the re-distribution layer 150 to the contact pad 144 of the electrical chip 140. The electrical chip 140 processes the electrical signals inputted at the contact pad 144 and communicates the processed electrical signals via the redistribution layer 150 and the contact pad 124 to the electrical chip 120. Alternatively or additionally, electrical signals outputted at the contact pad 124 of the electrical chip 120 are communicated via the re-distribution layer 150 to the contact pad 144 of the electrical chip 140. The electrical chip 140 processes the electrical signals inputted at the contact pad 144 and communicates the processed electrical signals via the re-distribution layer 150 and the contact pad 134 to the optical chip 130.

The molding material 160 is formed around the electrical chips 120, 140 to protect surfaces of the electrical chips 120, 140 not covered by the re-distribution layer 150. The molding material 160 provides mechanical strength for the semiconductor device 100. In the embodiment specifically shown in FIG. 1A, the molding material 160 is present between the electrical chips 120, 140 and the substrate 110. The optical chip 130 is completely outside the molding material 160. Example materials of the molding material 160 include, but are not limited to silicone rubber, epoxy resins, other resins or other epoxy materials.

The waveguide 170 is arranged over the molding material 160 and is in optical alignment with the optical component 132, such that optical signals outputted/inputted from/to the optical component 132 are optically coupled to/from the waveguide 170. In at least one embodiment, the optical alignment between the waveguide 170 and the optical component 132 is achieved without modifying a light path of the optical signals outputted from the optical component 132 and/or the waveguide 170. For example, in the embodiment specifically shown in FIG. 1A, the optical signals outputted from the optical component 132 enter the waveguide 170 at an angle that permits the optical signals to be further transmitted along the waveguide 170 by total internal reflection. In at least one embodiment, the optical alignment between the waveguide 170 and the optical component 132 is achieved by modifying a light path of the optical signals outputted from the optical component 132 and/or the waveguide 170, for example, by using a light reflecting element as described with respect to FIG. 5A. Other arrangements for achieving optical alignment between the waveguide 170 and the optical component 132 are within the scope of various embodiments.

As shown in FIG. 1A, the waveguide 170 is arranged over the re-distribution layer 150 which is over the molding material 160. The waveguide 170 has opposite first and second ends 171, 172. The first end 171 is adjacent to and at least partially co-elevational with the optical component 132, which comprises an edge emitting or detecting device optically communicable with the waveguide 170 at the first end 171, as indicated by an arrow 173. The optical signals received/transmitted from/to the first end 171 are communicated to/from the second end 172 to be communicated with other optical devices, as indicated by an arrow 174. Examples of other optical devices include, but are not limited to, an optical coupler, emitter or detector arranged on a circuit board upon which the semiconductor device 100 is to be mounted. In at least one embodiment, the waveguide 170 is straight as shown in FIG. 1A. In one or more embodiments, the waveguide 170 includes bent sections to arrange the second end 172 at a position suitable for optical communication with other optical devices. In some embodiments, the waveguide 170 includes a core layer sandwiched between a lower cladding layer and an upper cladding layer.

Example materials of the cladding layers include, but are not limited to, $SiO_2$ and a polymer. Example materials of the core layer include, but are not limited to, $GeO_2$-doped $SiO_2$ and $SiO_xN_y$.

The encapsulating material 180 is formed over the waveguide 170 to protect the waveguide. The encapsulating material 180 further covers, at least partially, the optical chip 130, as shown in FIG. 1A. In at least one embodiment, the encapsulating material 180 completely covers the optical chip 130. The encapsulating material 180 is filled in the space between the optical chip 130 and the re-distribution layer 150, and is also referred to as an underfill material. The encapsulating material 180 is further present between the first end 171 of the waveguide 170 and the optical component 132, and is transparent to the optical signals (i.e., light) communicable between the waveguide 170 and the optical component 132. Example materials of the encapsulating material 180 include, but are not limited to, a polymer having a silica filler, and other suitable non-conductive materials. In at least one embodiment, the encapsulating material 180 defines one or both of the cladding layers of the waveguide 170. For example, the encapsulating material 180 includes a polymer material suitable as both a cladding material and an underfill material.

The conductive bumps 190 are over the re-distribution layer 150. The conductive bumps 190 are at least partially co-elevational with the optical chip 130 in the thickness direction Z. At least one of the conductive bumps 190 is electrically coupled to at least one of the electrical chips 120, 140 or the optical chip 130 via the conductive layer 154. The conductive bumps 190 are electrically coupled to the conductive layer 154 of the re-distribution layer 150 by corresponding under-bump metallization (UBM) structures 192. The UBM structures 192 are at least partially embedded in the dielectric layer 152 and provide electrical connection between the re-distribution layer 150 and the corresponding conductive bumps 190. Example materials of the UBM structures 192 include, but are not limited to, titanium, titanium copper, nickel and alloys thereof. Example materials of the conductive bumps 190 include, but are not limited to, lead-free solder such as SnAg, and solder materials including one or more alloys of tin, lead, silver, copper, nickel, and bismuth.

At least one conductive post 194 is arranged between the conductive layer 154 and the contact pad 134 of the optical chip 130 to provide electrical connection between the optical chip 130 and the re-distribution layer 150. Example materials of the conductive post 194 includes, but are not limited to, lead-free solder materials such as Au and AuSn.

Figure 1B:
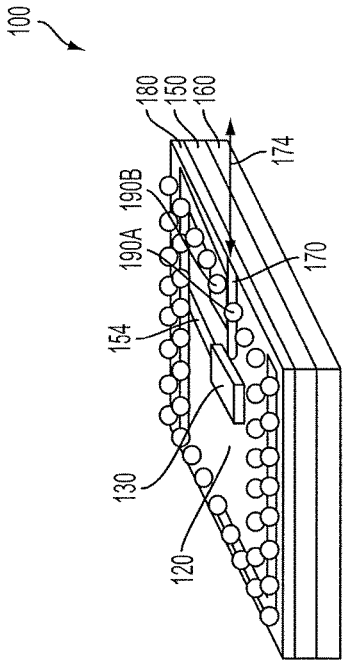
FIG. 1B is a schematic perspective view of a semiconductor device in accordance with some embodiments.

FIG. 1B is a schematic perspective view of the semiconductor device 100. Several components of the semiconductor device 100 are omitted from the perspective view in FIG. 1B. For example, the substrate 110 is omitted. FIG. 1B clarifies three-dimensional spatial relationships among components of the semiconductor device 100. For example, although the cross-sectional view in FIG. 1 illustrates one of the conductive bump 190 as extending through the waveguide 170, the perspective view in FIG. 1B clarifies that the waveguide 170 extends between adjacent conductive bumps 190A and 190B.

Figure 2:
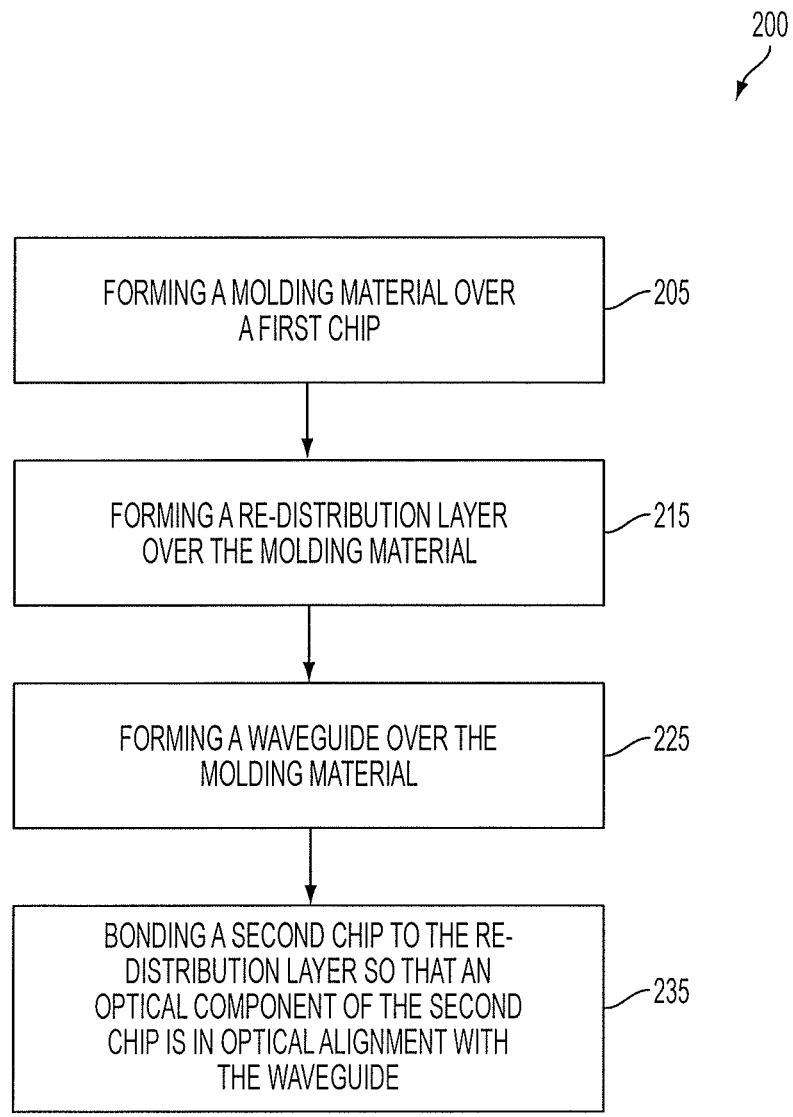
FIG. 2 is a flow chart of a method of manufacturing a semiconductor device in accordance with some embodiments.

FIG. 2 is a flow chart of a method 200 of manufacturing a semiconductor device in accordance with some embodiments, and FIGS. 3A-3G are schematic cross-sectional views of the semiconductor device at various stages during manufacture in accordance with some embodiments. In some embodiments, the method 200 is used to manufacture the semiconductor device 100 described with respect to FIGS. 1A-1B. Elements in FIGS. 3A-3G having corresponding elements in FIGS. 1A-1B are designated by the reference numerals of FIGS. 1A-1B increased by two hundred.

Figure 3A:
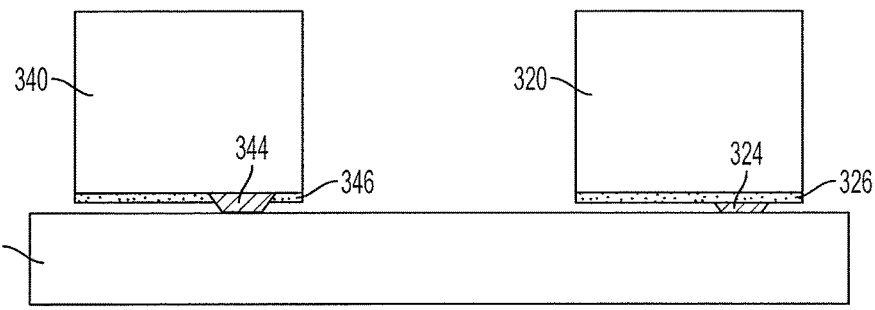
FIGS. 3A-3G are schematic cross-sectional views of a semiconductor device at various stages during manufacture in accordance with some embodiments.

At operation 205, a molding material is formed over a first chip. For example, as shown in FIG. 3A, electrical chips 320, 340 are releasably bonded to a carrier 305. In at least one embodiment, the electrical chip 340 is omitted. The carrier 305 is a temporary substrate for use in the manufacture of the semiconductor device. In some embodiments, the carrier 305 includes a silicon (Si) substrate, a glass substrate, a metal substrate or a ceramic substrate. The carrier 305 is temporarily bonded to the electrical chips 320, 340 by a releasable adhesive. Specifically, the surfaces of the electrical chips 320, 340 having contact pads 324, 344 and passivation layers 326, 346 formed thereon are placed to face the adhesive on the carrier 305 and then bonded to the carrier 305. A resulting structure 300A is obtained as shown in FIG. 3A.

Figure 3B:
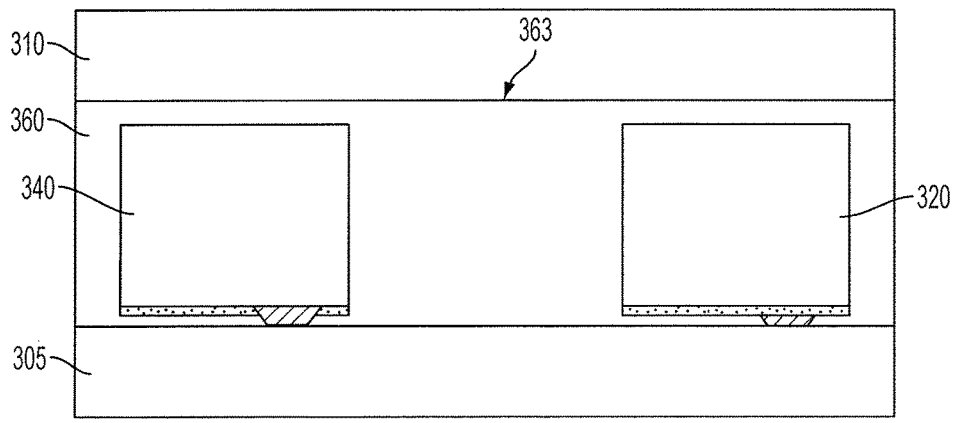

As shown in FIG. 3B, a molding material 360 is formed over the carrier 305 of the structure 300A to embed the electrical chips 320, 340 in the molding material 360. In some embodiments, the molding material 360 is formed in a transfer molding process. A raw molding material is dispensed in the form of liquid that flows around the electrical chips 320, 340 and fills the spaces between the electrical chips 320, 340 and the carrier 305. The raw molding material is then cured to form a hardened molding material 360. Other molding techniques are within the scope of various embodiments. Example materials of the molding material 360 include, but are not limited to silicone rubber, epoxy resins, other resins or other epoxy materials. In at least one embodiment, one or more fillers are added to improve mechanical strength and/or thermal conductivity of the molding material 360.

In one or more embodiments, the thicknesses of the electrical chips 320, 340 are different from each other, depending on various factors such as designs, manufacturers and manufacturing processes of the electrical chips 320, 340. Such electrical chips 320, 340 are embedded in a common molding material 360 which provides a planar surface 363 over the electrical chips 320, 340 for facilitating subsequent handling of the electrical chips 320, 340, despite different thicknesses of the electrical chips 320, 340.

A substrate 310 is then bonded to the planar surface 363 of the molding material 360. In some embodiments, the substrate 310 is another carrier for temporarily supporting the molding material 360 with the electrical chips 320, 340 embedded therein. In such embodiments, the substrate 310 is bonded to the molding material 360 by a releasable adhesive. In at least one embodiment, the substrate 310 is to be retained in the final product, and is bonded to the molding material 360 using other, permanent bonding techniques, such as non-releasable adhesive. A resulting structure 300B is obtained as shown in FIG. 3B.

Figure 3C:
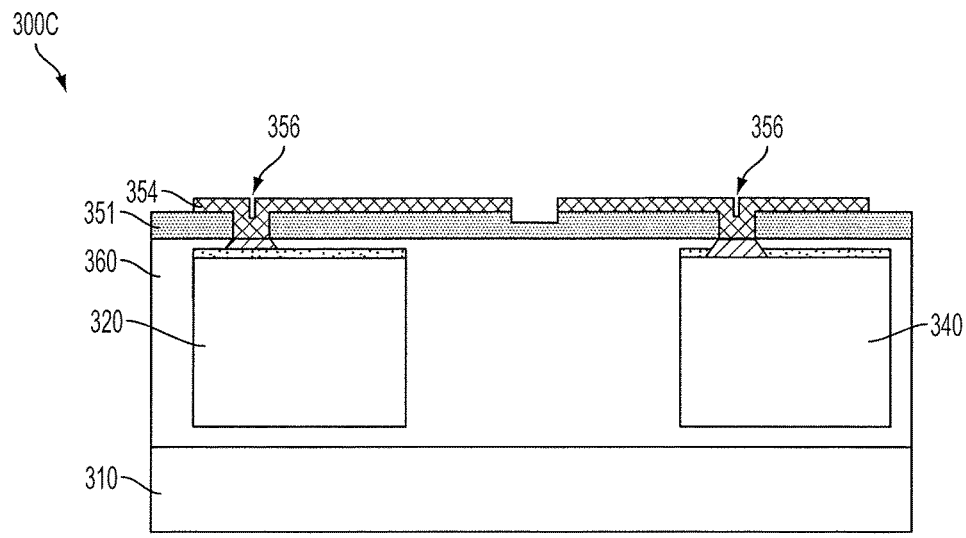

At operation 215, a re-distribution layer is formed over the molding material. For example, as shown in FIG. 3C, the structure 300B is turned up-side-down so that the substrate 310 is now arranged below the molding material 360 which is, in turn, arranged below the carrier 305. The adhesive temporarily bonding the electrical chips 320, 340 to the carrier 305 is then released. For example, the adhesive is released by ultraviolet radiation or thermal release through the carrier 305, the carrier 305 is then peeled off, and adhesive residues are subsequently removed by a solvent. As a result of the removal of the carrier 305, the contact pads 324, 344 of the electrical chips 320, 340 are exposed.

A dielectric layer 351 is formed over the surfaces of the electrical chips 320, 340 with the exposed contact pads 324, 344. An example material of the dielectric layer 351 includes PBO. One or more openings 356 are formed in the dielectric layer 351, for example by using a photolithographic process, to expose the contact pads 324, 344 of the electrical chips 320, 340. A conductive material is deposited over the dielectric layer 351, fills in the openings 356, and is then patterned to form the conductive layer 354. A resulting structure 300C is obtained as shown in FIG. 3C.

Figure 3D:
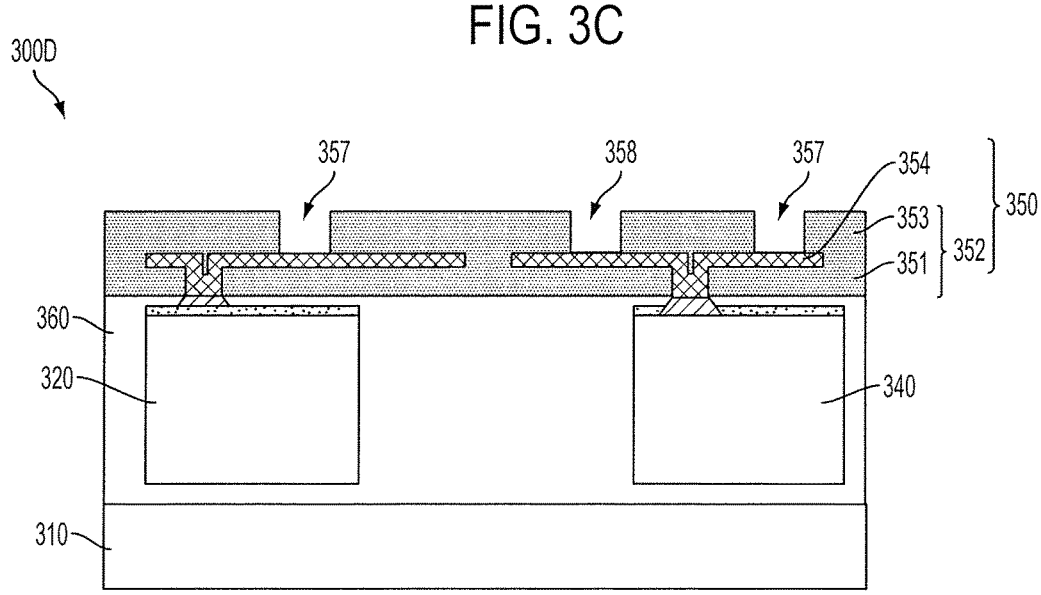

As shown in FIG. 3D, another dielectric layer 353 is formed over the conductive layer 354 in the structure 300C. One or more openings 357, 358 are formed in the dielectric layer 353, for example by using a photolithographic process, to expose the conductive layer 354 at locations where one or more conductive bumps and/or at least one conductive post for mounting an optical chip are to be formed. For example, the openings 357 correspond to locations where one or more conductive bumps are to be formed, and the opening 358 corresponds to a location where a conductive post for mounting an optical chip is to be formed. In some embodiments, the dielectric layer 351 and the dielectric layer 353 comprise the same dielectric material, e.g., PBO. In one or more embodiments, the dielectric layer 351 and the dielectric layer 353 comprise different dielectric materials. The dielectric layer 351 and the dielectric layer 353 together define a dielectric layer 352. The dielectric layer 352 and the conductive layer 354 together define a redistribution layer 350. In at least one embodiment, the re-distribution layer 350 includes more than one conductive layers and/or more than two dielectric layers. A resulting structure 300D is obtained as shown in FIG. 3D.

Figure 3E:
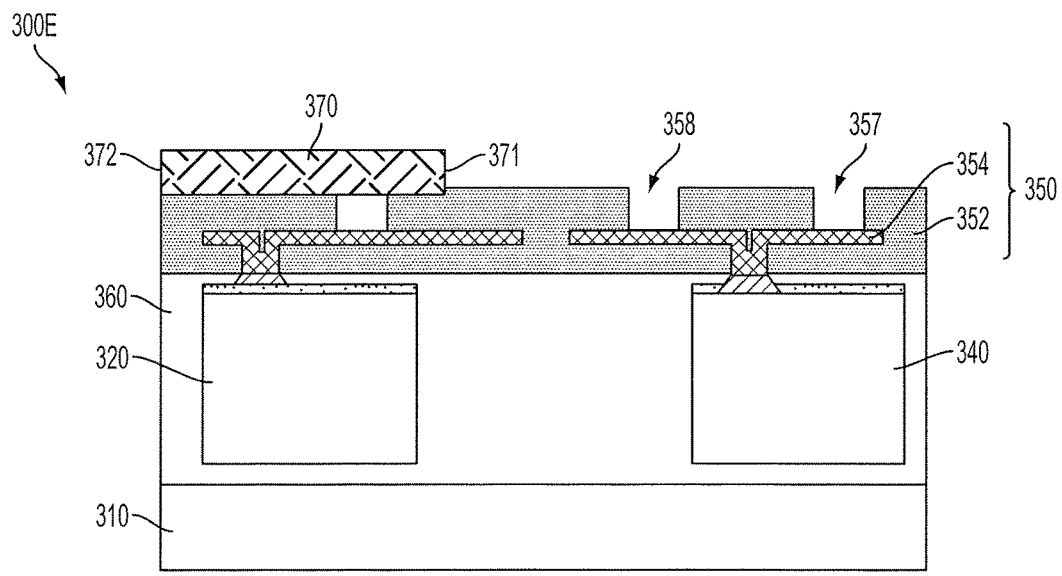

At operation 225, a waveguide is formed over the molding material. For example, as shown in FIG. 3E, a waveguide 370 is formed over the re-distribution layer 350 which is over the molding material 360 in the structure 300D. The waveguide 370 has a first end 371 arranged at a location to be optically coupled to an optical component of an optical chip to be mounted in the semiconductor device. The waveguide 370 further has second end 372 arranged at a location to be optically coupled to other optical components. In some embodiments, the formation of the waveguide 370 includes forming a lower cladding layer over the dielectric layer 352 of the redistribution layer 350. An example material of the lower cladding layer includes $SiO_2$. An example process for forming the lower cladding layer includes chemical vapor deposition (CVD). After the formation of the lower cladding layer, a core layer is formed, e.g., by CVD, over the lower cladding layer. An example material of the core layer includes $SiO_xN_y$. After the formation of the core layer, an upper cladding layer is formed, e.g., by CVD, over the core layer. An example material of the upper cladding layer includes $SiO_2$. One or more embodiments further comprise etching the lower cladding layer, the core layer and the upper cladding layer in regions outside the area where the waveguide 370 is to be formed. In at least one embodiment, a polymer layer is deposited as one or both of the lower upper cladding layer, as described herein. A resulting structure 300E is obtained as shown in FIG. 3E.

Figure 3F:
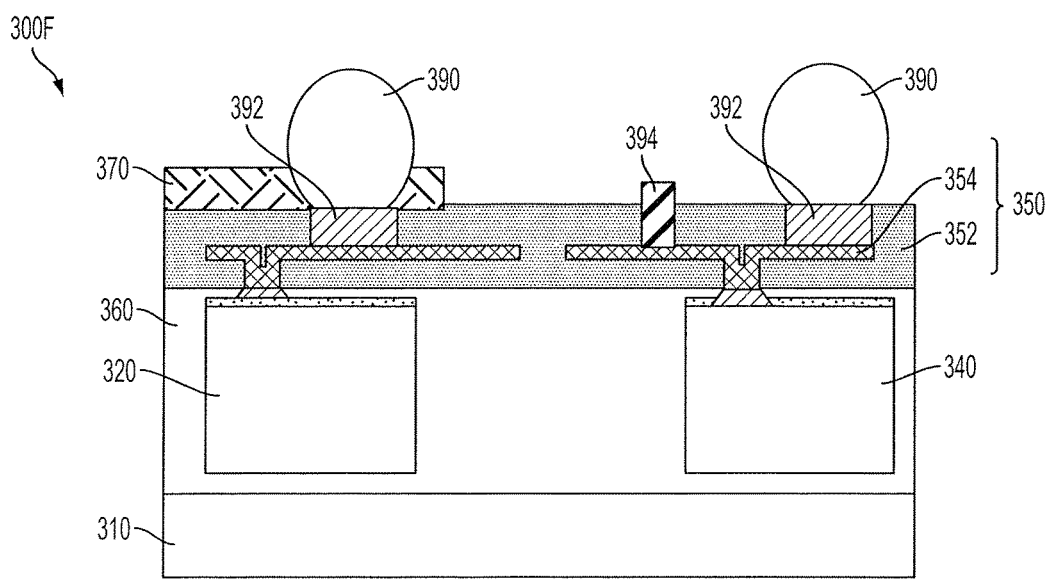

As shown in FIG. 3F, UBM structures 392 are formed in the corresponding openings 357, at least one conductive post 394 is formed in the corresponding opening 358 of the structure 300E, and one conductive bumps 390 are formed over the corresponding UBM structures 392. The UBM structures 392 include one or more conductive layers deposited in the corresponding openings 357. For example, a lower layer in the UBM structures 392 is configured to improve adhesion with the conductive layer 354 exposed in the corresponding openings 357, and includes, for example, Al and/or Cu. An upper layer in the UBM structures 392 is configured to improve adhesion with the corresponding conductive bumps 390, and includes, for example, Ti. The conductive bumps 390 include solder material formed over the corresponding UBM structures 392, for example, by screen printing or electroplating. Example materials for the conductive bumps 390 include Pb/Sn compounds or lead-free solder materials comprising one or more of Sn, Cu, Ag, Ni, and Au. The conductive post 394 includes a lead-free solder, such as AuSn, Au deposited into the corresponding opening 358 in a manner similar to the formation of the conductive bumps 390. A resulting structure 300F is obtained as shown in FIG. 3F.

Figure 3G:
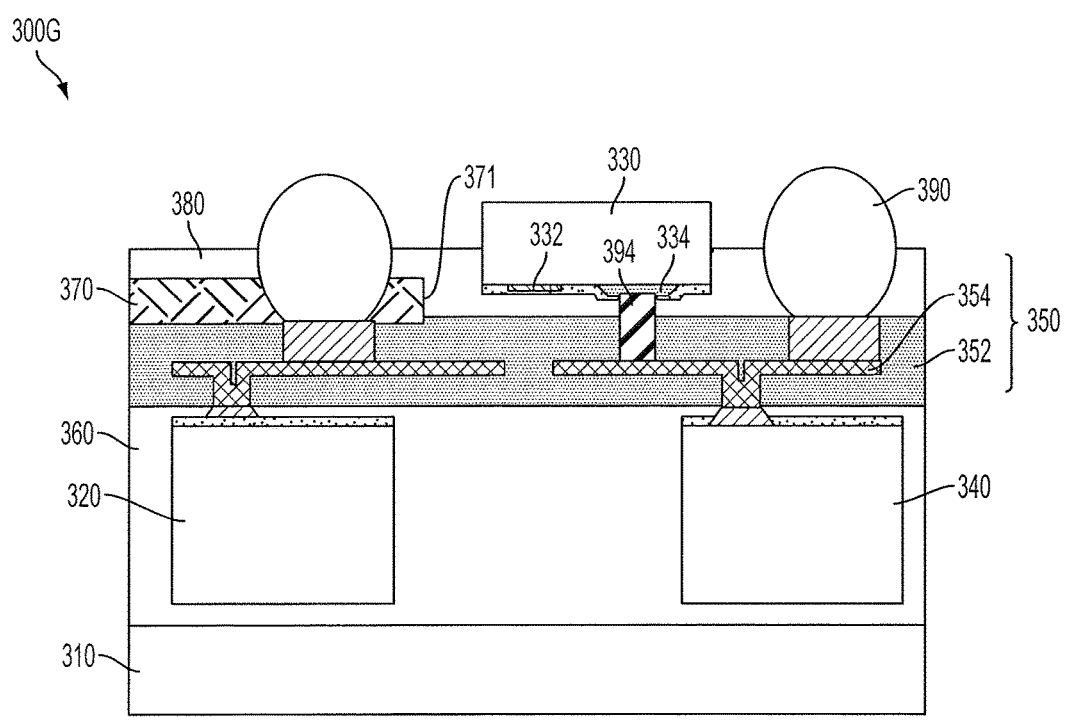

At operation 235, a second chip is bonded to the re-distribution layer so that an optical component of the second chip is in optical alignment with the waveguide. For example, as shown in FIG. 3G, an optical chip 330 having an optical component 332 and at least one contact pad 334 is flip-chip bonded to the re-distribution layer 350. The flip-chip bonding process is performed such that the contact pad 334 is bonded to the corresponding conductive post 394, and the optical component 332 is in optical alignment with the waveguide 370. For example, the optical chip 330 is flip-chip bonded such that the light path of optical signals outputted from the optical component 332 enters the first end 371 of the waveguide 370 at an angle that permits the optical signals to be further transmitted along the waveguide 370 by total internal reflection.

The flip-chip bonding process is performed by reflowing or thermal compressing the conductive post 394 to bonded the at least one contact pad 334 to the corresponding pattern of the pressure sensor 154 via the reflow or compressed conductive post 394. The solder material of the conductive post 394 is different from the solder material of the conductive bumps 390, such that the conductive bumps 390 are not reflown during the reflowing process of the conductive post 394 and the corresponding contact pad 334 which, in turn, results in a composition having a higher melting point than the conductive bumps 390. As a result, when the conductive bumps 390 are subsequently reflown to bond the semiconductor device to, e.g., a circuit board, the bonding at the conductive post 394 between the optical chip 330 and the re-distribution layer 350 remains stable, without shifting the optical component 332 out of optical alignment with the waveguide 370.

An encapsulating material 380 is deposited over the resulting structure obtained after bonding the optical chip 330 to the re-distribution layer 350. An example material for the encapsulating material 380 includes a polymer. In at least one embodiment, the polymer of the encapsulating material 380 functions as a cladding layer of the waveguide 370, and one or more processes for forming a cladding layer of the waveguide 370 is/are omitted. A resulting semiconductor device 300G is obtained as shown in FIG. 3G.

Compared to other approaches, some embodiments provide a semiconductor device with a smaller footprint and a more compact MCM. For example, some other approaches arrange both electrical and optical chips on the same side of a re-distribution layer. As a result, an MCM obtained in accordance with the other approaches has a wider foot print than the semiconductor device in accordance with some embodiments which has the electrical chip and optical chip stacked over each other in a thickness direction of the re-distribution layer. In one or more embodiments, the arrangement of the electrical chip and optical chip on opposite sides of the re-distribution layer also relaxes the requirements for forming the re-distribution layer, resulting in a higher through-put in the re-distribution layer formation. In some embodiments, the arrangement of the electrical chip and optical chip on opposite sides of the re-distribution layer further enhances signal isolation and/or thermal dissipation.

Another advantage achievable in accordance with some embodiments is the accurate optical alignment between the optical chip and a corresponding waveguide. In some other approaches, the electrical and optical chips are embedded in a common molding material. The molding process generally involves one or more heating and cooling cycles. Thermal expansion and/or contraction of the molding material due to such heating and cooling cycles and/or the shrinkage of the molding material is/are likely to shift the position of the optical chip embedded in the molding material. It is possible that the shifting in the position of the optical chip will cause misalignment of the optical chip with the corresponding waveguide, resulting in a defective product, or at least a product with performance characteristics lower than an expected specification. In contrast, the optical chip in the semiconductor device in accordance with some embodiments is located completely outside the molding material around the electrical chip. In at least one embodiment, the optical chip is bonded to the semiconductor device after the molding process of the electrical chip. As a result, it is possible to avoid one or more potential, negative impacts of the molding process and/or the molding material on the position of the optical chip. Consequently, the optical alignment of the optical chip with the corresponding waveguide remains accurate as intended.

A further advantage achievable in accordance with some embodiments is an increased through-put of the pick-and-place process. As discussed herein, in some other approaches, the electrical and optical chips are embedded in a common molding material. To ensure the intended optical alignment between the optical chip and a corresponding waveguide, the molding process is performed with stricter requirements than those for molding an electrical chip. The stricter requirements result in a slower through-put of the molding process. In some embodiments, by bonding the optical chip after the molding process, it is possible to perform the molding process for the electrical chip at less strict requirements than in the other approaches, resulting in a higher throughout of the pick-and-place process.

Figure 4:
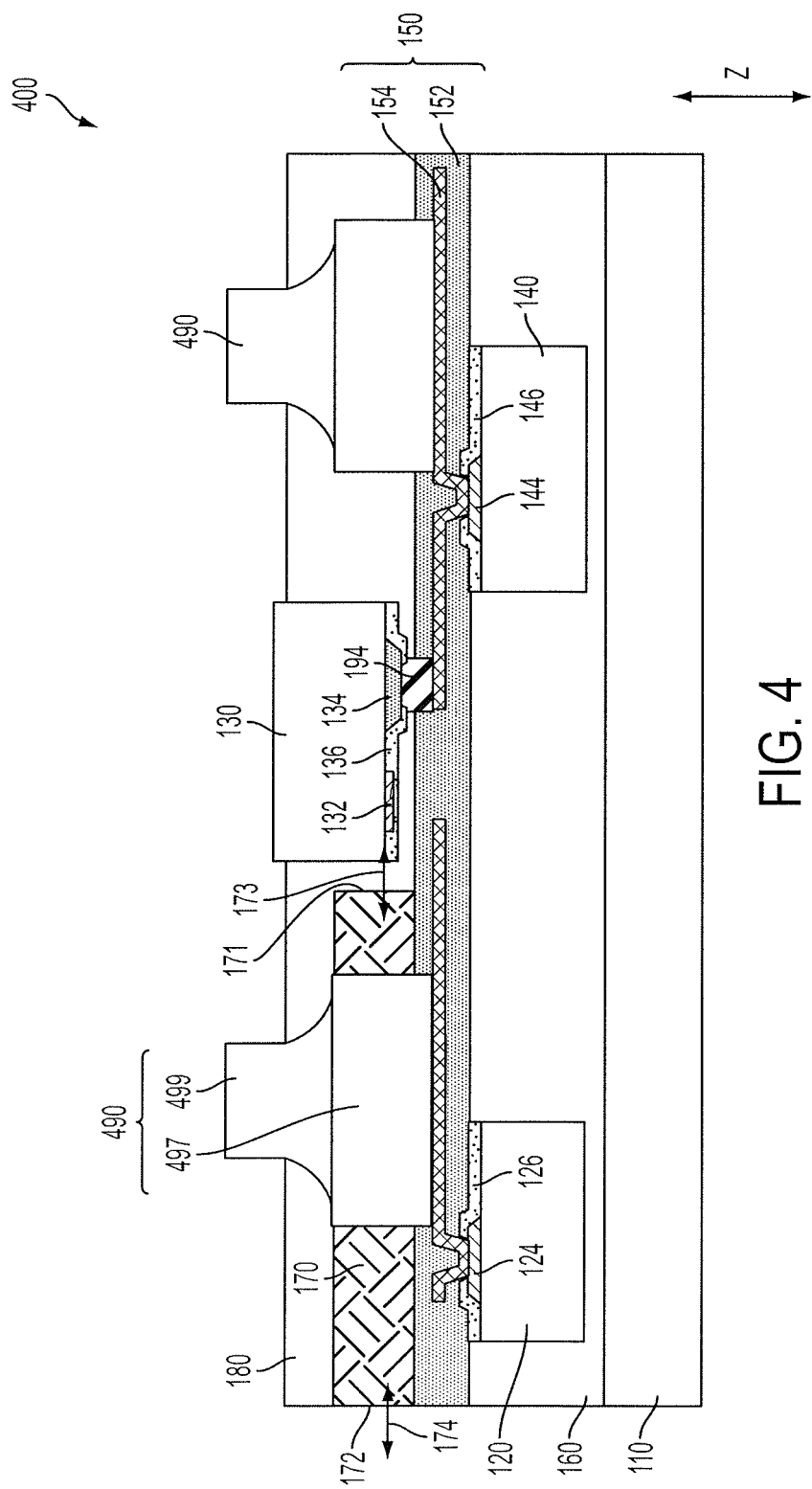
FIG. 4 is a schematic cross-sectional view of a semiconductor device in accordance with some embodiments.

FIG. 4 is a schematic cross-sectional view of a semiconductor device 400 in accordance with some embodiments. The semiconductor device 400 is similar to the semiconductor device 100 in various aspects. A difference between the semiconductor device 400 and the semiconductor device 100 resides in the replacement of the conductive bumps 190 with stud bumps 490. Example materials for the stud bumps 490 include, but are not limited to, Au, Cu, Al, Pt and Pd. In at least one embodiment, the stud bumps 490 are formed by wire-bonding method. Specifically, a wire-bonder dispenses a metal wire to a location where a stud bump 490 is to be formed. The wire-bonder generates a spark to form a ball at the end of the dispensed wire. The ball is placed on the conductive layer 154 at the location where the stud bump 490 is to be formed, and defines a lower, larger portion 497 of the stud bump 490. The wire-bonder subsequently breaks the wire, leaving an upper, smaller portion 499 of the stud bump 490 on the lower portion 497. Other methods for forming the stud bumps 490 are within the scope of various embodiments. One or more effects achievable with the semiconductor device 100 is/are also achievable with the semiconductor device 400.

Figure 5:
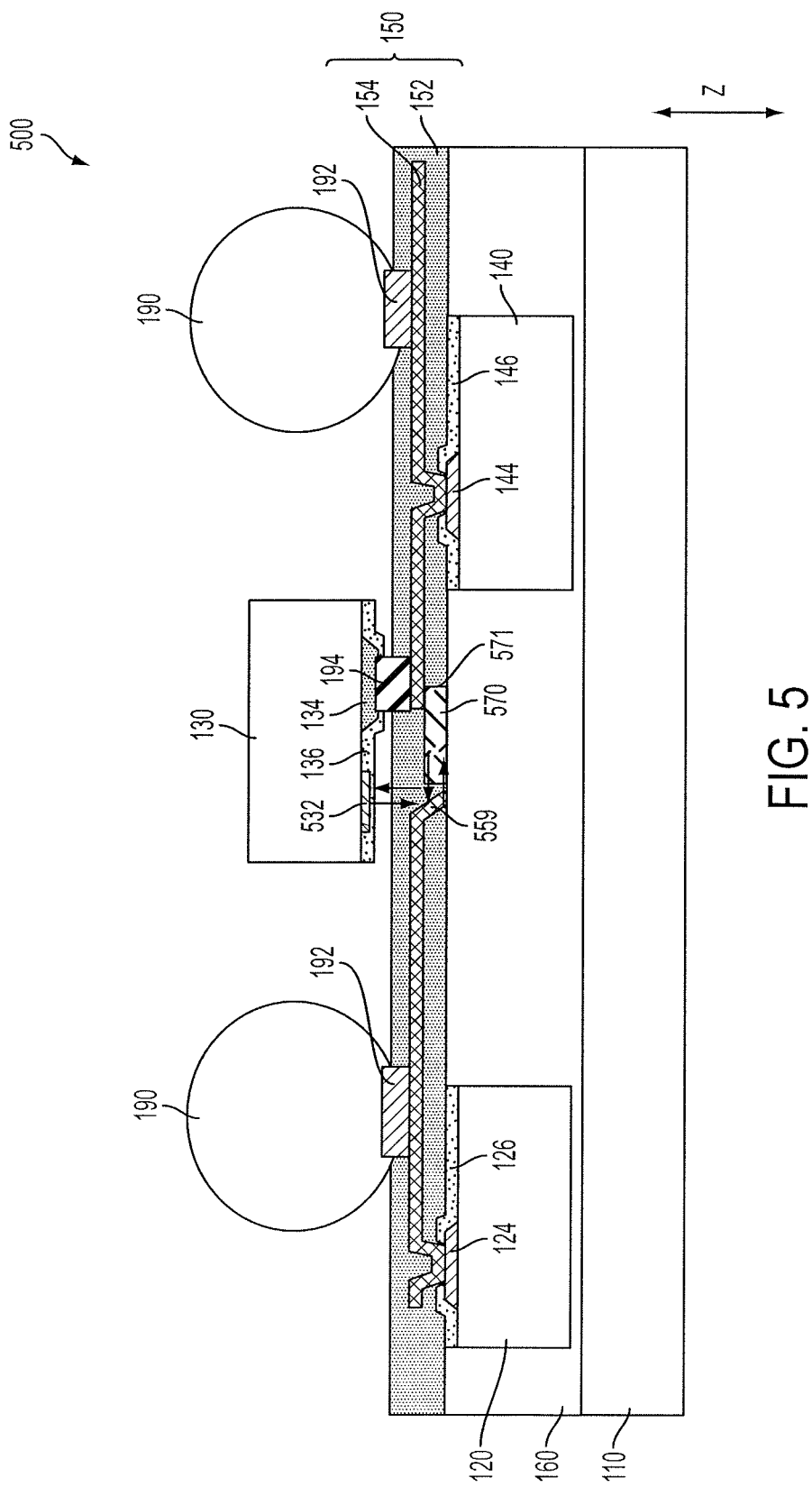
FIG. 5 is a schematic cross-sectional view of a semiconductor device in accordance with some embodiments.

FIG. 5 is a schematic cross-sectional view of a semiconductor device 500 in accordance with some embodiments. The semiconductor device 500 is similar to the semiconductor device 100 in various aspects. A difference between the semiconductor device 500 and the semiconductor device 100 resides in the position of the waveguide. Specifically, the semiconductor device 500 includes a waveguide 570 arranged between the optical chip 130 and the molding material 160 in the thickness direction Z of the molding material 160. The waveguide 570 is embedded in the dielectric layer 152. A mirror 559 is embedded in the dielectric layer 152 to reflect optical signals between an optical component 532 of the optical chip 530 and an end 571 the waveguide 570, as shown by the arrows in FIG. 5. The optical alignment between the optical component 132 and the waveguide 570 is ensured by the mirror 559. The dielectric layer 152 is transparent to the optical signals (i.e., light) communicable between the optical component 532 and the waveguide 570. In some embodiments, the optical component 532 is a face emitting or detecting device. In at least one embodiment, the mirror 559 is a part of the conductive layer 154. In at least one embodiment, the conductive bumps 190 in the semiconductor device 500 are replaced by stud bumps similar to the stud bumps 490 described with respect to FIG. 4. One or more effects achievable with the semiconductor device 100 is/are also achievable with the semiconductor device 500.

FIGS. 6A-6D are schematic cross-sectional views of the semiconductor device 500 at various stages during manufacture, in accordance with some embodiments. Elements in FIGS. 6A-6D having corresponding elements in FIGS. 3A-3G are designated by the reference numerals of FIGS. 3A-3G increased by three hundreds.

Figure 6A:
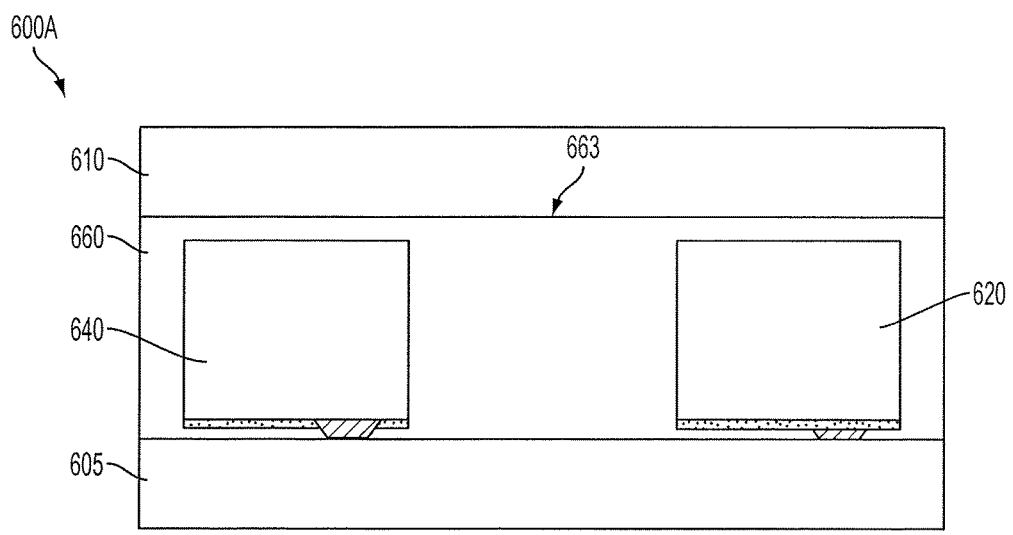
FIGS. 6A-6D are schematic cross-sectional views of a semiconductor device at various stages during manufacture in accordance with some embodiments.

As shown in FIG. 6A, a structure 600A similar to the structure 300B, is obtained as described with respect to FIGS. 3A-3B. Specifically, the structure 600A includes electrical chips 620, 640 releasably bonded to a carrier 605, a molding material 660 formed over the carrier 605 to embed the electrical chips 620, 640, and a substrate 610 then bonded to a planar surface 663 of the molding material 660.

Figure 6B:
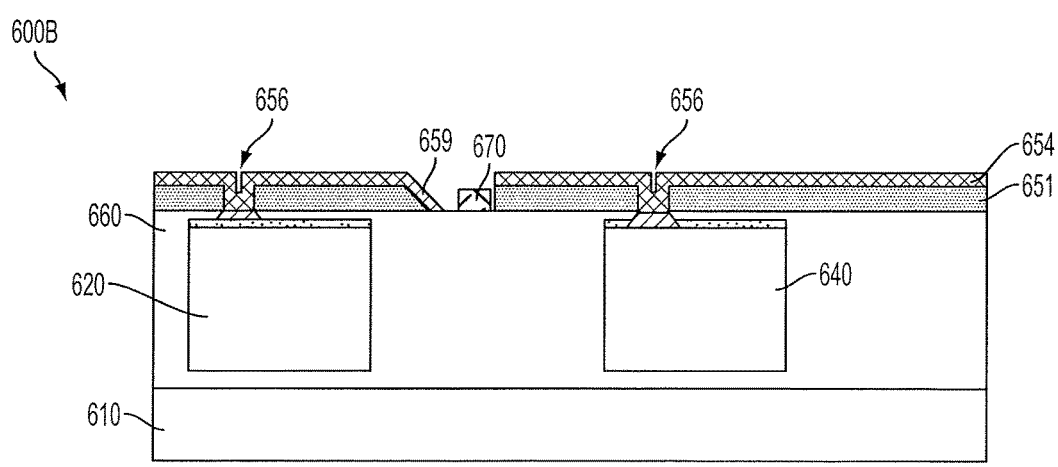

As show in FIG. 6B and described with respect to FIG. 3C, the structure 600A is turned up-side-down, and the carrier 605 is removed to expose contact pads of the electrical chips 620, 640. A dielectric layer 651 is formed over the electrical chips 620, 640, one or more openings 656 are formed in the dielectric layer 651 to expose the contact pads of the electrical chips 620, 640 and a conductive material is deposited over the dielectric layer 651, fills in the openings 656, and is then patterned to form the conductive layer 654.

A waveguide 670 is formed over the molding material 660, using one or more processes described with respect to FIG. 3E. In at least one embodiment, the waveguide 670 is formed over the dielectric layer 651. A mirror 659 is formed as a part of the conductive layer 654. An example method for forming the mirror 659 is described in U.S. patent application Ser. No. 13/747,394, entitled "Optical Element Structure And Optical Element Fabricating Process," filed Jan. 22, 2013, an entire content of which is incorporated by reference herein. Other methods for forming the mirror 659 are within the scope of various embodiments. A resulting structure 600B is obtained as shown in FIG. 6B.

Figure 6C:
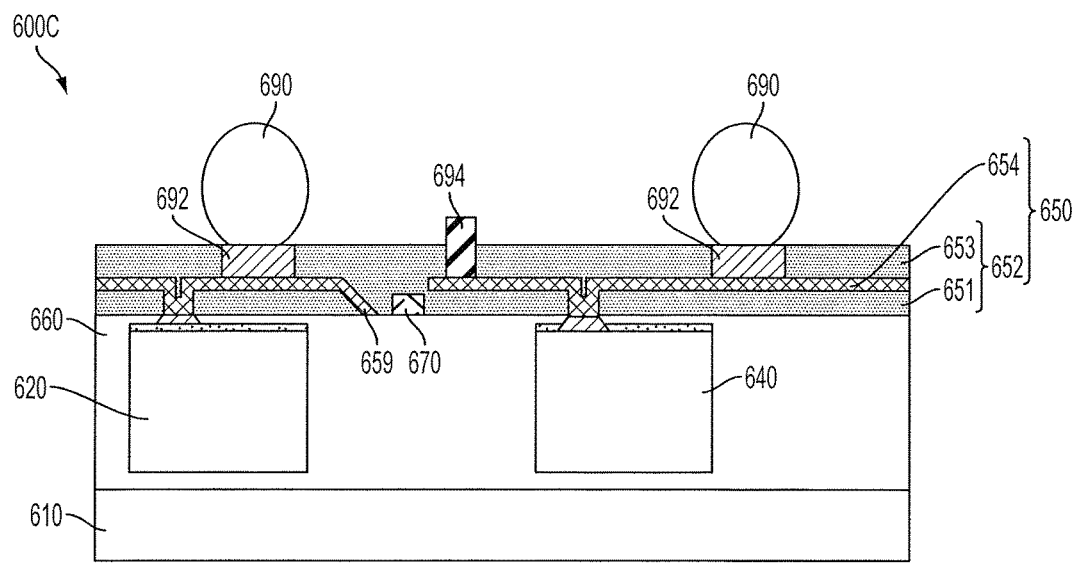

As shown in FIG. 6C and described with respect to FIGS. 3D-3F, another dielectric layer 653 is formed over the conductive layer 654, and one or more openings are formed in the dielectric layer 653, to expose the conductive layer 654 at locations where one or more conductive bumps and/or at least one conductive post for mounting an optical chip are to be formed. The dielectric layer 651 and the dielectric layer 653 together define a dielectric layer 652. The dielectric layer 652 and the conductive layer 654 together define a re-distribution layer 650. UBM structures 692 and at least one conductive post 694 are formed in the corresponding openings. A resulting structure 600C is obtained as shown in FIG. 6C.

Figure 6D:
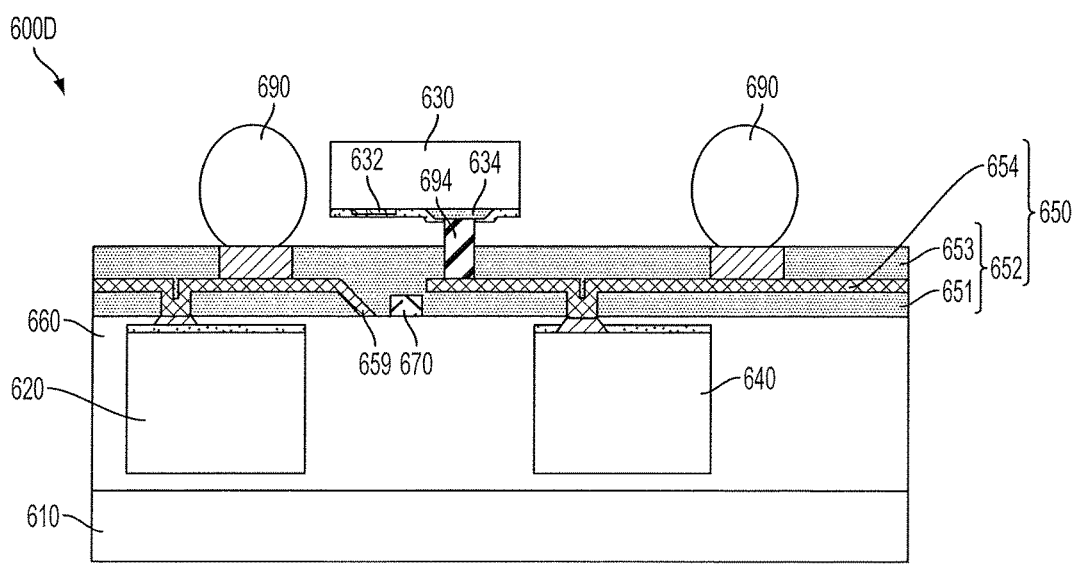

As shown in FIG. 6D and described with respect to FIG. 3G, an optical chip 630 having an optical component 632 and at least one contact pad 634 is flip-chip bonded to the re-distribution layer 650. The flip-chip bonding process is performed such that the contact pad 634 is bonded to the corresponding conductive post 694, and the optical component 632 is in optical alignment, via the mirror 659, with the waveguide 670. A resulting semiconductor device 600d is obtained as shown in FIG. 6D.

The above methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a semiconductor device comprises a first chip, a dielectric layer over the first chip, and a second chip over the dielectric layer. A conductive layer is embedded in the dielectric layer and is electrically coupled to the first chip and the second chip. The second chip comprises an optical component. The first chip and the second chip are arranged on opposite sides of the dielectric layer in a thickness direction of the dielectric layer.

According to some embodiments, a semiconductor device comprises a first chip, a molding material embedding the first chip therein, a second chip over the first chip, and waveguide over the molding material. The second chip is completely outside the molding material. The second chip comprises an optical component. The waveguide is optically coupled to the optical component of the second chip.

In a method of manufacturing a semiconductor device in accordance with some embodiments, a molding material is formed over a first chip to embed the first chip in the molding material. A re-distribution layer is formed over the molding material. The re-distribution layer is electrically coupled to the first chip. A waveguide is formed over the molding material. A second chip is bonded to the re-distribution layer. The re-distribution layer is electrically coupled to the second chip. The second chip comprises an optical component in optical alignment with the waveguide.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A device comprising:
   a first chip comprising active devices;
   a dielectric layer over the first chip;
   a conductive layer embedded in the dielectric layer, the conductive layer comprising a first portion electrically coupled to the first chip, and a second portion forming a mirror;
   a second chip over the dielectric layer, the second chip electrically coupled to the first portion of the conductive layer, the second chip comprising an optical component, wherein the first chip and the second chip are arranged on opposite sides of the dielectric layer in a thickness direction of the dielectric layer; and
   a waveguide optically coupled to the optical component of the second chip, wherein the mirror is configured to reflect a light transmitted between the optical component and the waveguide.

2. The device of claim 1, wherein the dielectric layer is transparent, and the dielectric layer comprises:
   a first portion between the mirror and the waveguide; and
   a second portion between the mirror and the optical component.

3. The device of claim 1, wherein the dielectric layer has a major top surface, and the mirror forms a 45 degree angle with the major top surface.

4. The device of claim 1, wherein the waveguide is in the dielectric layer.

5. The device of claim 1 further comprising an electrical connector, and the first portion and the second portion of the conductive layer are portions of a continuous conductive line, wherein the continuous conductive line is electrically connected to the electrical connector.

6. The device of claim 5, wherein the electrical connector comprises a solder region.

7. The device of claim 6, wherein a portion of the solder region and a portion of the second chip are at a same level.

8. The device of claim 1, wherein the second chip comprises a transparent layer at a surface of the second chip, and wherein the waveguide and the optical component are optically coupled through the transparent layer.

9. The device of claim 8, wherein optical signals are configured to be coupled to the optical component through a bottom surface of the transparent layer.

10. A device comprising:
    a first chip;
    a molding material, wherein the first chip is embedded in the molding material;
    a second chip over the first chip, the second chip comprising an optical component;
    a waveguide over the molding material, wherein the waveguide and the second chip are configured to transmit optical signals in between; and
    a re-distribution layer between the first chip and the second chip, wherein the re-distribution layer electrically couples the first chip to the second chip, and a portion of the re-distribution layer acts as a mirror receiving and reflecting the optical signal.

11. The device of claim 10, wherein the mirror is configured to reflect the optical signals between the waveguide and the second chip.

12. The device of claim 10, wherein the mirror is configured to change a direction of a horizontally transmitted optical signal to a vertical direction, and to change a direction of a vertically transmitted optical signal to a horizontal direction, with the horizontal direction being parallel to a major top surface of the molding material.

13. The device of claim 10 further comprising a plurality of transparent dielectric layers, wherein the re-distribution layer and the waveguide are both in the plurality of transparent dielectric layers.

14. The device of claim 13, wherein the plurality of transparent dielectric layers comprises:
a first portion between the mirror and the waveguide; and
a second portion between the mirror and the optical component.

15. The device of claim 10 further comprising a solder region, wherein the re-distribution layer comprises a continuous conductive line, and the continuous conductive line comprises:
a first portion electrically coupled to the solder region; and
a second portion acting as the mirror.

16. A device comprising:
a first chip embedded in a molding material;
a re-distribution layer disposed over the molding material, the re-distribution layer comprising a first portion electrically coupled to the first chip, and a second portion, wherein the second portion has a slant surface;
a waveguide disposed over the molding material, wherein the waveguide is configured to receive or transmit optical signals traveling in a first direction parallel to a major top surface of the molding material; and
a second chip electrically coupled to the re-distribution layer, the second chip comprising an optical component configured to receive or transmit the optical signals traveling in a second direction perpendicular to the major top surface of the molding material, wherein the slant surface is configured to reflect the optical signals.

17. The device of claim 16 further comprises a plurality of transparent dielectric layers, wherein the waveguide is embedded in the plurality of transparent dielectric layers.

18. The device of claim 16, wherein the re-distribution layer comprises electrically conductive lines.

19. The device of claim 16, wherein the slant surface acts as a mirror reflecting the optical signals traveling in the first direction and the optical signals traveling in the second direction.

20. The device of claim 16, wherein the waveguide has a bottom surface contacting a top surface of the molding material.

* * * * *